United States Patent [19]

Filhol

[11] Patent Number: 4,668,644

[45] Date of Patent: May 26, 1987

[54] SUBSTRATE OF DIELECTRIC CERAMIC MATERIAL AND PROCESS FOR MANUFACTURING THE SAME

[75] Inventor: Pierre Filhol, Orsay, France

[73] Assignee: Societe Xeram, Courbevoie, France

[21] Appl. No.: 760,926

[22] Filed: Jul. 31, 1985

[30] Foreign Application Priority Data

Aug. 3, 1984 [FR] France .................. 84 12332

[51] Int. Cl.$^4$ ............ C04B 35/04; C04B 35/10; C04B 35/46
[52] U.S. Cl. ..................... 501/119; 501/127; 501/136; 501/153
[58] Field of Search ............ 501/136, 135, 119, 153, 501/127

[56] References Cited

U.S. PATENT DOCUMENTS

| | | | |
|---|---|---|---|
| 2,305,327 | 6/1938 | Thurnauer | 501/136 OR |
| 3,534,286 | 10/1970 | Holm et al. | 501/134 X |
| 3,578,471 | 5/1971 | Lachman | 501/119 OR |
| 3,698,923 | 10/1972 | Stetzon et al. | 501/153 X |
| 4,071,881 | 1/1978 | Bacher | 501/136 X |
| 4,306,909 | 12/1981 | Oda et al. | 501/135 X |
| 4,307,198 | 12/1981 | Oda et al. | 501/136 X |
| 4,308,570 | 12/1981 | Burn | 501/136 X |
| 4,316,965 | 2/1982 | Oda et al. | 501/135 X |
| 4,353,047 | 10/1982 | Noguchi et al. | 501/138 X |
| 4,506,026 | 3/1985 | Hodgkins | 501/135 OR |

FOREIGN PATENT DOCUMENTS 1564260 4/1969 France .
1565857 5/1969 France .

OTHER PUBLICATIONS

Chemical Abstracts, vol. 93, No. 14, 10/06/80, p. 617, No. 141880u; and PL-B-006, (Kombinat Produkcyjno-Naukowy Podzespolow Elektronicznych "Unitra--Elpod"), 12/22/79.
Chemical Abstracts, vol. 90, No. 16, 4/16/79, p. 688, No. 131758j; and JPA 78 149 696, (Sony Corp.), 12/27/78.
Chemical Abstracts, vol. 95, No. 4, 1981, p. 690, No. 71943g; and JPA 81-37274, (Taiyo Yuden Co., Ltd.), 4/10/81.

*Primary Examiner*—Ferris H. Lander
*Assistant Examiner*—Karl Group
*Attorney, Agent, or Firm*—Oblon, Fisher, Spivak, McClelland & Maier

[57] ABSTRACT

A dielectric ceramic substrate is obtained exclusively from aluminum oxide, magnesium oxide and titanium oxide, the respective amounts of said magnesium oxide and said titanium oxide being so selected as to represent substantially equivalent molar proportions. The novel substrate is adapted to be used in electronics in the fields of thin layer and thick layer technology, as well for producing microprocessor protection cases, multilayer substrates and the like.

8 Claims, No Drawings

SUBSTRATE OF DIELECTRIC CERAMIC MATERIAL AND PROCESS FOR MANUFACTURING THE SAME

FIELD OF THE INVENTION

The present invention relates to substrates made of dielectric ceramic material. It is also related to a process of manufacturing such substrates.

BACKGROUND OF THE INVENTION

Substrates of dielectric ceramic material are used in the field of electronics, in particular for manufacturing a great variety of products, such as substrates adapted to constitute supports or carriers of circuits used in the technological fields of the so-called "thin layer" and "thick layer" techniques, manufacture of protection cases for microprocessors or for microprocessor interconnections, manufacture of multilayer substrates etc.

According to the most wide-spread technique alumina is used for producing such ceramic material.

In hyperfrequency applications, the tangent of the dielectric loss angle (tg $\delta$) should be small, e.g. in general smaller than $5 \cdot 10^{-4}$ at 10 GHz. Reactive alumina of 99.5% purity can be sintered at temperatures comprised between 1500° C. and 1600° C. and may have loss angle tangent values lower than $2 \cdot 10^{-4}$ at frequencies up to 10 GHz. Less pure alumina, e.g. 96% or 89% alumina which essentially contain the elements Si, Mg, Ca, Na, K can be sintered at temperatures as low as 1400° C., however their loss angle tangent values are higher than $10^{-3}$ at 10 GHz.

Furthermore, according to another requirement a material used as a substrate in the field of microelectronics must have as smooth a surface as possible, the surface roughness being in the order of a micron. In other words, the surface roughness of the ceramic material should be reduced as much as possible. In addition, it is desirable to carry out the sintering treatment of the material involved at as low a temperature as possible.

The present invention allows all these requirements to be met. The invention provides indeed a ceramic substrate adapted to be sintered at temperatures lower than 1400° C. The dielectric loss angle tangent tg $\delta$ of the ceramic material, as measured at 10 GHz, is lower than $5 \cdot 10^{-4}$, and said material in the form of a substrate has a reduced surface roughness.

SUMMARY OF THE INVENTION

According to one aspect of the present invention, there is provided a substrate of dielectric ceramic material which is made exclusively from magnesium oxide, titanium oxide and aluminum oxide and wherein the respective amounts of magnesium oxide and titanium oxide are selected so as to correspond to substantially equivalent molar proportions.

According to another aspect of the invention, there is provided a process of manufacturing a substrate, which comprises:

(a) providing a mixture of powderous magnesium oxide and powderous titanium oxide in substantially equivalent proportions;
(b) calcining said mixture;
(c) preparing a slurry containing the thus calcined mixture, alumina powder, a binding agent and a solvent;
(d) shaping and drying said slurry to provide a raw substrate; and
(e) sintering said raw substrate after removal of said binding agent, in such a manner that the mean surface roughness corresponds to value in the order of one micron.

DETAILED DESCRIPTION OF PREFERRED EMBODIMENTS

The various objects, features and advantages will become more clearly apparent from the following detailed description including numeric examples, which is given by way of illustration, but not of limitation.

With a view to producing the substrate in accordance with the invention, the following successive steps are carried out:

In a first step a mixture of very fine magnesium oxide (MgO) powder and very fine titanium oxide (TiO$_2$) powder is prepared. The molar proportion of each oxide of the mixture is comprised between 0.9 and 1.1 for each oxide. Preferably, the proportion is the same for each oxide.

In a second step the two thouroughly mixed oxide powders are calcined at a temperature comprised between 1000° C. and 1300° C. This calcination initiates a chemical reaction of the two oxides and produces a fine magnesium oxide and titanium oxide powder.

In a third step the thus calcined mixture is used for preparing a slurry by adding thereto fine alumina powder, a binding agent and a solvent. The calcined mixture and the alumina are in the form of a powder the grain size of which is smaller than one micron. The binding agent used is polyvinyl alcohol, polyvinyl butyral or methyl polymethacrylate. The solvent is a conventional solvent compatible with the binding agent.

Depending on the selected shaping method defloculating agents or plastifiers may also be added to said slurry.

In a fourth step the resulting slurry is moulded and then dried in accordance with conventional methods.

Finally, in a fifth step, the thus obtained substrate is sintered after removal of the binding agent incorporated therein.

It should be noted that the calcination of the powderous mixture of magnesium oxide (MgO) and titanium oxide (TiO$_2$) in the above-mentioned second step is controlled in such a manner that the mean size of the grains of particles is 0.5 $\mu$m. The granulometric size of the calcined powder is a function of the grain size of the starting powders, which should normally be 0.5 $\mu$m, and of calcination temperature that should normally be comprised between 1000° C. and 1280° C.

In the third step comprising admixing alumina powder to the calcined MgO and TiO$_2$ powder, an alumina powder (Al$_2$O$_3$) having also a mean grain of particle size of 0.5 $\mu$m should be used.

A mean granulometric size or grain, size of 0.5 micron will thus be obtained, whereby after moulding and sintering a surface roughness, or surface grain size, in the order of one micron will be obtained.

The resulting material consequently is constituted by magnesium, titanium, aluminum and oxygen.

Various measurements have been taken on materials produced by the process according to the invention. Thus the density, the roughness, the dielectric constant and the dielectric loss angle tangent at 10 GHz have been determined.

In the selected examples described herein-after the materials are in the form of substrates having side lengths of 5 cm×5 cm and a thickness of 0.5 to 1 mm. They are constituted by equimolar amounts of MgO and $TiO_2$ and 1% to 98% by weight of alumina with respect to the total weight of MgO and $TiO_2$. Their density is comprised between 9.1 and 17.1; their dielectric loss angle tangents are smaller than $5 \cdot 10^{-4}$. Furthermore said materials have a surface roughness lower than 0.15 μm ($R_A$) and are adapted to be used without any previous mechanical machining such as honing or polishing; this smoothness of the surface results from the small size of the surface grains (1 μm) that is achieved when applying the manufacturing process according to the present invention.

The results of measurements carried out for different proportions of alumina and magnesium oxide/titanium oxide mixture are listed in Tables 1 and 2 appended hereto.

Using the various compositions, materials have been produced by sintering, in the above-mentioned fifth step according to the novel process, at respective temperatures of 1220° C., 1260° C., 1300° C., etc.

The density d as expressed in gram per cm³ (g/cm³) of each substrate obtained has been measured, as well as:
the dielectric constant ϵ at the frequency of 10 GHz, and
the dielectric loss tangent tg δ at the frequency of 10 GHz.

The materials were optimized with a view to obtaining a tg δ value lower than $5 \cdot 10^{-4}$.

The results of these measurements as listed in the Tables show that by adding a mixture of oxides $MgO/TiO_2$ to the alumina $Al_2O_3$ it becomes possible to decrease the sintering temperature, which constitutes one of the advantages offered by the present invention, this being achieved without impairing the dielectric properties of the material. Also, by adding alumina to the $MgO/TiO_2$ mixture the dielectric constant is lowered without any substantial increase of the sintering temperature. The first case indicated in Table 1, using a 100% mixture of magnesium oxide and titanium oxide, as well as the last case indicated in Table 2 using 100% alumina are well known in the art. In the first case the dielectric constants are elevated, while in the second case elevated sintering temperatures are required.

Furthermore it becomes apparent that particularly advantageous materials are obtained when the composition of the powder mixture is so selected that the weight proportion of aluminum oxide with respect to the total weight of the magnesium and titanium oxides is comprised between 1% and 35%, or between 80% and 98%. In this manner improved dielectric properties are obtained for sintering temperatures lower than 1380° C., the dielectric loss angle tangent being lower than $2 \cdot 10^{-4}$ at 10 GHz.

It is thus obvious that the material according to the invention, based on magnesium, titanium and aluminum is advantageous in the manufacture of substrates, in that it involves lower dielectric loss values and lower sintering temperatures than alumina, as well as a dielectric constant lower than that of magnesium titanate.

The materials according to the invention indeed have a dielectric constant comprised between 9.1 and 17.1, dielectric losses lower than $5 \cdot 10^{-4}$ at 10 GHz and when produced in the form of substrates their surface roughness $R_A$ is lower than 0.15 μm.

Of course any compositions intermediary between those of the above examples may be used for producing dielectric substrates having a surface roughness lower than 0.15 μm. Such substrates offer the additional advantage of requiring no subsequent mechanical machining operation.

Metals such as chrome, copper, gold and the like may be deposited on a substrate according to the invention, in the form of a thin layer having a thickness of several hundred Angströms, without discontinuities, by vaporization, spraying or other methods. Such deposits may be treated by photogravure techniques; conductor paths can thus be provided on such substrates, exhibiting satisfactory definition and having, e.g., a typical width of several tens of microns and a thickness of several microns, due to the fineness of the surface grain. Thus electric circuits produced on such substrates show most satisfactory characteristics in the hyperfrequency range.

The invention is not limited to the embodiments disclosed herein; many variants and modifications may be envisaged by those skilled in the art without departing from the spirit and scope of the invention as defined in the appended claims.

TABLE 1

| Composition by weight | Sintering temperature °C. | 1220 | 1260 | 1300 | 1340 | 1380 | 1420 | 1460 | 1500 |
|---|---|---|---|---|---|---|---|---|---|
| >99% MgO/TiO2 | d | — | 3,75 | 3,76 | 3,78 | — | | | |
|  | ϵ | 16,8 | 17,1 | 17,1 | 17 | — | | | |
|  | tg · 10⁴ | 36 | 2,5 | 1,5 | 4 | — | | | |
| 90% MgO—TiO2 + 10% Al2O3 | d | 3,64 | 3,56 | 3,69 | 3,73 | 3,70 | 3,68 | | |
|  | ϵ | 13,4 | 15,3 | 15,9 | 16,6 | 16,1 | 16 | | |
|  | tg · 10⁴ | 5 | 1 | 2,8 | 1,7 | 1 | 1,5 | | |
| 70% MgO—TiO2 + 30% Al2O3 | d | | 3,48 | 3,52 | 3,59 | 3,58 | 3,58 | | |
|  | ϵ | | 11,3 | 14,1 | 14,2 | 14,4 | 14,4 | | |
|  | tg · 10⁴ | | 5,4 | 2,7 | 3 | 1,4 | 3,5 | | |
| 50% MgO—TiO2 + 50% Al2O3 | d | | | | 3,61 | 3,59 | 3,59 | 3,59 | |
|  | ϵ | | | | 12,9 | 13 | 13 | — | |
|  | tg · 10⁴ | | | | — | 10 | 5 | — | |

TABLE 2

| Composition by weight | Sintering temperature °C. | 1220 | 1260 | 1300 | 1340 | 1380 | 1420 | 1460 | 1500 |
|---|---|---|---|---|---|---|---|---|---|
| 30% MgO—TiO2 + | d | | | | 3,59 | 3,68 | 3,69 | | |

TABLE 2-continued

| Composition by weight | Sintering temperature °C. | 1220 | 1260 | 1300 | 1340 | 1380 | 1420 | 1460 | 1500 |
|---|---|---|---|---|---|---|---|---|---|
| 70% Al$_2$O$_3$ | | | | | 10,3 | 11,1 | 11,6 | | |
| | tg · 10$^4$ | | | | — | 7 | 5 | | |
| 10% MgO—TiO$_2$ + 90% Al$_2$O$_3$ | d | - | — | 3,78 | 3,83 | 3,85 | 3,84 | 3,86 | |
| | | | | — | 9,8 | 10,2 | 10,2 | 10,4 | 10,4 |
| | tg · 10$^4$ | | | — | 1,2 | 1,5 | 1 | 3 | 2 |
| >99% Al$_2$O$_3$ | d | | | | | | | 3,81 | 3,87 |
| | | | | | | | | 9,1 | 9,5 |
| | tg · 10$^4$ | | | | | | | 2,8 | 1,4 |

I claim:

1. A substrate of dielectric ceramic material having a dielectric constant between 9.1 and 17.1, a dielectric loss less than $5 \times 10^{-4}$ at 10 GHz and a surface roughness less than 0.15 μm, consisting of aluminum oxide, magnesium oxide and titanium oxide, the respective amounts of said magnesium oxide and said titanium oxide being so selected as to represent substantially equivalent molar proportion of between 0.9 to 1.1 moles for each of magnesium oxide and titanium oxide, and wherein the proportion by weight of aluminum oxide with respect to the total weight of magnesium oxide and titanium oxide is between 1% and 98%.

2. A ceramic substrate according to claim 1, wherein the proportion by weight of aluminum oxide with respect to the total weight of magnesium oxide and titanium oxide is between 1% and 35%.

3. A ceramic substrate according to claim 1, wherein the proportion by weight of aluminum oxide with respect to the total weight of magnesium oxide and titanium oxide is between 80% and 98%.

4. A process of manufacturing a substrate according to claim 1, which comprises the steps of:

(a) providing a mixture consisting of powderous magnesium oxide and powderous titanium oxide in substantially equivalent molar proportions;

(b) calcining said mixture;

(c) preparing a slurry from the thus calcined mixture, alumina powder, a binding agent and a solvent;

(d) shaping and drying said slurry to provide a substrate;

(e) sintering the thus obtained substrate after removal of said binding agent, in such a manner that the surface roughness of the resulting substrate has a mean value of one micron.

5. A process according to claim 4, wherein said step of calcining is carried out at a temperature between 1000° C. and 1300° C.

6. A process according to claim 4, wherein the proportion of alumina is selected so as to be between 1% and 98%.

7. A process according to claim 4, wherein the alumina powder and the powderous calcined mixture have a mean grain size of about 0.5 micron.

8. A process according to claim 4, wherein said sintering step is carried out at a temperature lower than 1380° C.

* * * * *